(12) United States Patent
Summerfield

(10) Patent No.: US 10,700,914 B1
(45) Date of Patent: Jun. 30, 2020

(54) DIGITAL PRE-DISTORTION (DPD) IN A WIRELESS TRANSMITTER

(71) Applicant: Analog Devices, Inc., Norwood, MA (US)

(72) Inventor: Steve Summerfield, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/578,085

(22) Filed: Sep. 20, 2019

(51) Int. Cl.
  H04B 1/04       (2006.01)
  H04L 27/36      (2006.01)
  H03F 1/32       (2006.01)
  H03F 3/24       (2006.01)
  H03F 3/189      (2006.01)

(52) U.S. Cl.
  CPC ......... H04L 27/368 (2013.01); H03F 1/3247 (2013.01); H03F 3/189 (2013.01); H03F 3/24 (2013.01); H04B 1/0475 (2013.01)

(58) Field of Classification Search
  CPC ..... H04L 27/368; H03F 1/3247; H03F 3/189; H03F 3/24; H04B 1/0475
  USPC .................................. 455/114.2, 296, 115.1
  See application file for complete search history.

(56) References Cited

U.S. PATENT DOCUMENTS

| | | | |
|---|---|---|---|
| 6,304,140 B1 | 10/2001 | Thron et al. | |
| 7,023,273 B2 | 4/2006 | Johnson et al. | |
| 7,200,367 B1 | 4/2007 | Wright et al. | |
| 7,372,918 B2 * | 5/2008 | Muller | H04L 27/368 375/296 |
| 7,746,167 B1 | 6/2010 | Summerfield | |
| 7,904,033 B1 | 3/2011 | Wright et al. | |
| 8,023,588 B1 * | 9/2011 | Benson | H04L 25/03343 330/147 |
| 8,451,055 B2 * | 5/2013 | Fudaba | H03F 1/3247 330/149 |
| 9,036,736 B2 * | 5/2015 | Chen | H04L 27/367 375/297 |
| 9,374,196 B2 | 6/2016 | Yang et al. | |
| 9,730,165 B2 * | 8/2017 | Ahmed | H04W 52/244 |
| 2003/0035494 A1 | 2/2003 | Bauder et al. | |
| 2019/0273541 A1 * | 9/2019 | Ohshima | H04B 1/0475 |

FOREIGN PATENT DOCUMENTS

EP    1732207    12/2006

* cited by examiner

Primary Examiner — Sonny Trinh
(74) Attorney, Agent, or Firm — Patent Capital Group

(57) ABSTRACT

Embodiments may relate to digital predistortion (DPD). DPD logic may identify whether the wireless signal output power of a wireless signal that is to be transmitted is above a power threshold. The signal output power is over (or, in some embodiments, equal to) the power threshold, then the DPD logic may operate in accordance with a pre-stored DPD mode wherein DPD is performed on the wireless signal based on one or more pre-stored DPD coefficients. If the signal output power is under (or, in some embodiments, equal to) the power threshold, then the DPD logic may operate in accordance with a continuously-updated DPD mode. Other embodiments may be described or claimed.

18 Claims, 7 Drawing Sheets

DIGITAL PRE-DISTORTION (DPD) IN A WIRELESS TRANSMITTER

FIELD OF THE DISCLOSURE

This disclosure relates in general to the field of computing and, more particularly, though not exclusively, to a system and method for digital pre-distortion (DPD) in a wireless transmitter.

BACKGROUND

A wireless signal may, subsequent to transmission, become distorted due to a number of factors. Such factors may include, for example, environmental conditions, interference from other wireless transmissions, or other factors. Therefore, DPD may be performed based on predicted distortion of the wireless signal. The DPD may pre-distort the signal in anticipation of the distortion which may occur during transmission of the signal. In this case, the result may be that the distortion may, itself, remove the pre-distortion of the signal such that the signal may be received by a wireless receiver in a relatively un-distorted state.

SUMMARY OF THE DISCLOSURE

Figure 1:
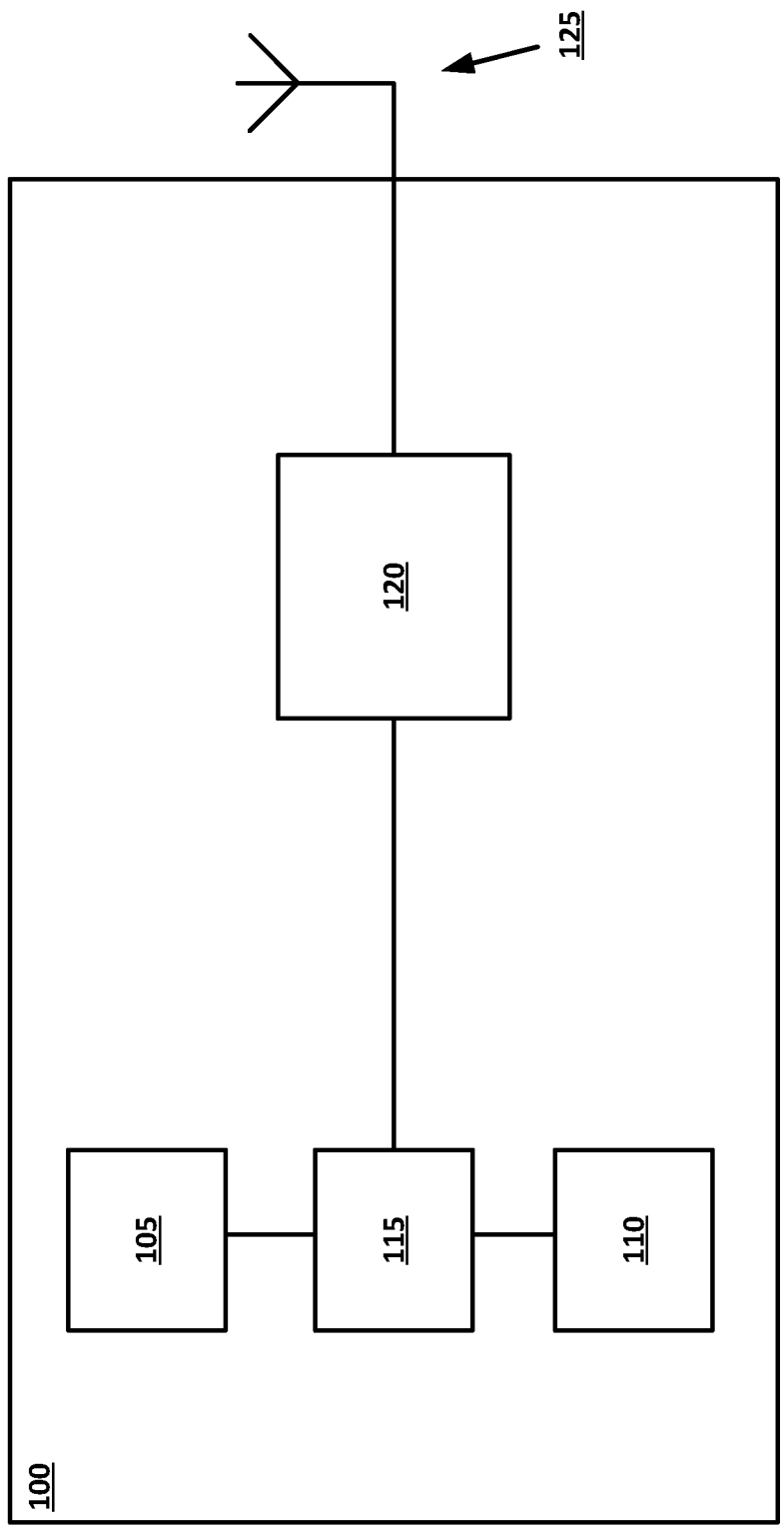
FIG. 1 depicts a simplified block diagram of an example wireless transmitter, in accordance with various embodiments.

Embodiments may relate to digital predistortion (DPD). DPD logic may identify whether the wireless signal output power of a wireless signal that is to be transmitted is above a power threshold. The signal output power is over (or, in some embodiments, equal to) the power threshold, then the DPD logic may operate in accordance with a pre-stored DPD mode wherein DPD is performed on the wireless signal based on one or more pre-stored DPD coefficients. If the signal output power is under (or, in some embodiments, equal to) the power threshold, then the DPD logic may operate in accordance with a continuously-updated DPD mode. Other embodiments may be described or claimed.

Some embodiments may relate to a method of performing DPD of a wireless communication. The method may comprise identifying, by DPD logic based on an identification that the wireless signal output power of a wireless signal that is to be transmitted is above a power threshold, that the wireless signal is to be transmitted in accordance with a pre-stored DPD mode that is related to a pre-stored coefficient. The method may further comprise shifting, by the DPD logic based on the identification that the wireless signal is to be transmitted in accordance with the pre-stored DPD mode, from a continuously-updating DPD mode to the pre-stored DPD mode, wherein the continuously-updating DPD mode relates to a transmission based on a continuously-updated coefficient. The method may further comprise facilitating, by the DPD logic, transmission of the wireless signal based on the pre-stored coefficient.

Other embodiments may relate to one or more non-transitory computer-readable media comprising instructions that, upon execution fo the instructions by a computing device, are to cause a DPD logic of the computing device to identify a wireless signal with an output power, wherein the wireless signal is to be transmitted by a wireless transmitter of the computing device. The instructions may be further to identify, based on an identification that the output power is above a power threshold, that the wireless signal is to be transmitted in accordance with a pre-stored DPD mode instead of a continuously-updating DPD mode. The instructions may be further to facilitate transmission of the wireless signal in accordance with the pre-stored DPD mode.

Other embodiments may include an electronic device operable to transmit a wireless signal. The electronic device may comprise a memory. The memory may be to store a continuously-updated coefficient related to transmission in accordance with a continuously-updating DPD mode. The memory may be further to store a pre-stored coefficient related to transmission in accordance with a pre-stored DPD mode. The electronic device may further comprise a DPD logic coupled with the memory. The DPD logic may be to update the continuously-updated coefficient based on a time interval. The DPD logic may be further to update the pre-stored coefficient based on an update power threshold. The DPD logic may be further to identify whether to operate in accordance with the continuously-updated DPD mode or the pre-stored DPD mode based on a comparison of a power threshold to an output power of a wireless signal that is to be transmitted.

DETAILED DESCRIPTION

As noted, it may be desirable for a wireless transmitter to pre-distort a wireless signal prior to transmission of the signal. In legacy transmitters, the pre-distortion may be performed using coefficients or variables (generally referred to herein using the term "coefficients") that are updated based on a time interval. However, in some embodiments the specific coefficients used may be most efficient when used in conjunction with a specific power output of the wireless transmitter. If the power output changes, then the coefficients identified for the previous power output may no longer be as efficient for the subsequent power output. Rather, the coefficients identified for the previous power output may introduce undesirable transients to the spectral performance of the wireless transmitter. Embodiments herein may, therefore, be generally related to mitigation of the impact of fast power transitions by switching to a stored table of coefficients that were estimated at a last-known high-power profile.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

As discussed, adaptive DPD may be employed in many cellular radio products to allow low-cost, high-efficiency amplifiers to be used while maintaining spectral compliance. DPD updates may occur at an interval which is determined by the computational resource available. For high-performance, low-cost, low-power solutions this interval may be on the order of seconds. When operating in a cellular network, the output signal power of the wireless transmitter may change rapidly, and DPD performance may be sensitive to the transmitted power. As a result, the DPD performance may degrade when the power changes between adaptations of the coefficients.

The negative effect of a downwards power transient (i.e., transmitting with an output power that is lower than the output power at which the coefficients were most recently calculated) may be significantly low than the negative effect of an upwards power transient (i.e., transmitting with an output power that is higher than the output power at which the coefficients were most recently calculated). Previous solutions to address the negative effects of downward transients have typically been resource hungry in terms of logic or memory.

By contrast, embodiments herein may provide a desirable cost/performance point to address low power constraints in massive multiple-input-multiple-output (MIMO) and small cell applications. Specifically, embodiments may store a prior high-power DPD coefficient set (referred to herein as "pre-stored" coefficients) and monitor the transmitted power through an integration circuit with a time constant of the order of milliseconds. The transmitted power is compared to a power threshold, and the DPD logic may switch to the pre-stored coefficient set if the transmitted power is over the power threshold. This technique may therefore reduce the duration and effect of upwards power transients from on the order of seconds to on the order of milliseconds, thereby significantly reducing the negative effects of the upwards power transients.

In some embodiments, the rules for the update of the pre-stored coefficient set may be formulated in terms of a tolerance band and a time-decaying threshold (referred to herein as an "update power threshold"). The rules may be based on, for example, ensuring that the pre-stored coefficients are relevant to the present state of the wireless transmitter. The power threshold and the update power threshold may be selected based on factors such as ensuring that the transients protection is well-balanced with sustained performance of the wireless transmitter at various power levels. In some embodiments, the power threshold or the update power threshold may be based on prior calibration of the thresholds. The calibration may be performed to identify characteristics of a given wireless transmitter or power amplifier, and identify a desirable threshold, set of thresholds, or initial coefficients which may be used to perform efficient DPD.

FIG. 1 depicts a simplified block diagram of an example wireless transmitter 100, in accordance with various embodiments. It will be understood that this block diagram is intended for the purpose of discussion of various elements, and is not intended to be a definitive wiring circuit diagram. Specifically, the wireless transmitter 100 may include a processor 115. The processor 115 may be, for example, a general processing unit (GPU), a central processing unit (CPU), a single-core processor, a multi-core processor, a core of a multi-core processor, etc. Generally, the processor 115 may be configured to execute, or facilitate the execution of, computer-readable instructions.

The processor 115 may be communicatively coupled with a memory 105. The memory 105 may be, for example, a volatile or non-volatile memory which may be configured to store various instructions or coefficients. For example, the memory 105 may be a flash memory, a double data rate (DDR) memory, or some other type of memory. In some embodiments, the memory 105 may be configured to store one or more coefficients, or sets of coefficients, related to the DPD operation. In some embodiments, the coefficients may be arranged in a table format, whereas in other embodiments the coefficients may be arranged in another type of format.

The DPD logic 110 may be configured to perform one or more techniques related to DPD operation as described herein. For example, in some embodiments the DPD logic 110 may be configured to identify, receive, process, alter, facilitate transmission of, or perform some other operation on or related to a wireless signal. The DPD logic 110 may be implemented as a hardware module, a software module, firmware, or some combination thereof.

The wireless transmitter 100 may further include additional radio frequency (RF) circuitry 120. The RF circuitry 120 may include, for example, one or more power amplifiers (PAs), switches, filters, etc. which may further process or alter the wireless signal prior to transmission from the wireless transmitter 100. Similarly to the DPD logic 110, the RF circuitry 120 may be implemented as a hardware module, a software module, firmware, or some combination thereof.

The wireless transmitter 100 may further include one or more antennas such as antenna 125. The antenna 125 may be a hardware element that is within, partially within, positioned on the surface of, or communicative coupled with the housing of the wireless transmitter 100. The antenna 125 may be configured to send or receive wireless signals based, for example, on direction from the processor 115 or some other element of the wireless transmitter 100. In some embodiments, the wireless transmitter 100 may have a single antenna that is configured to send or receive wireless signals over a variety of bandwidths in accordance with a variety of protocols such as third generation partnership project (3GPP) protocols, institute of electrical and electronics engineers (IEEE) protocols, or some other protocols.

Such protocols may include third generation (3G), fourth generation (4G), fifth generation (5G), long term evolution (LTE), LTE-advanced (LTE-A), WiMAX, Wi-Fi, Bluetooth, or some other type of wireless protocol either already known or hereafter developed.

As previously noted, the depiction of the various elements of the wireless transmitter 100 are intended as a simplified example for the purpose of discussion. In other embodiments, the wireless transmitter 100 may be configured differently, may have more or fewer elements, etc. For example, in some embodiments various of the elements may be combined with one another. Specifically, in some embodiments the DPD logic 110 may be, or may be an element of, the processor 115 (or vice-versa) or the RF circuitry 120. In some embodiments, various of the elements such as the DPD logic 110 may be an element of a power amplifier. In some embodiments, the wireless transmitter 100 may have elements in addition to those shown, e.g. extra memories, extra processors, etc. In some embodiments the connections between various elements may be different than shown (e.g., the DPD logic 110 may be directly coupled with the memory 105 or the RF circuitry 120). Other variations may be present in other embodiments.

As previously described, the DPD logic may be configured to operate in one of two modes. A first mode may be what is referred to herein as a continuously-updated DPD mode. In this mode, the coefficients used to calculate pre-distortion of a wireless signal may be updated at a time-based interval, and may be referred to as continuously-updated coefficients. Such a time-based interval may be, for example, the native rate of the processor 115, the native rate of the DPD logic 110, or some other rate. In some embodiments, the native rate at which the continuously-updated coefficients are updated may be on the order of seconds and may be, for example, between approximately 0.5 seconds and approximately 5 seconds. However, it will be understood that in other embodiments that rate may be higher or lower based, for example, on factors such as power characteristics, memory characteristics, processing characteristics, or other characteristics of the wireless transmitter 100.

The other mode may be what is referred to herein as a pre-stored DPD mode. In the pre-stored DPD mode, the DPD logic 110 may use pre-stored DPD coefficients from a table of DPD coefficients. The pre-stored DPD coefficients may be related to DPD coefficients used when the output signal power was previously over a given power threshold. The pre-stored DPD coefficients may be updated based on an update power threshold which may decrease over time, as will be discussed in greater detail with respect to FIG. 6.

Generally, the DPD logic 110 may be configured to identify whether the output power of a wireless signal that is to be transmitted by the wireless transmitter 100 (and, more particularly, the antenna 125 of the wireless transmitter) is over a power threshold. Based on that comparison, the DPD logic 110 may identify whether to operate in accordance with the continuously-updated DPD mode or the pre-stored DPD mode.

Figure 2:
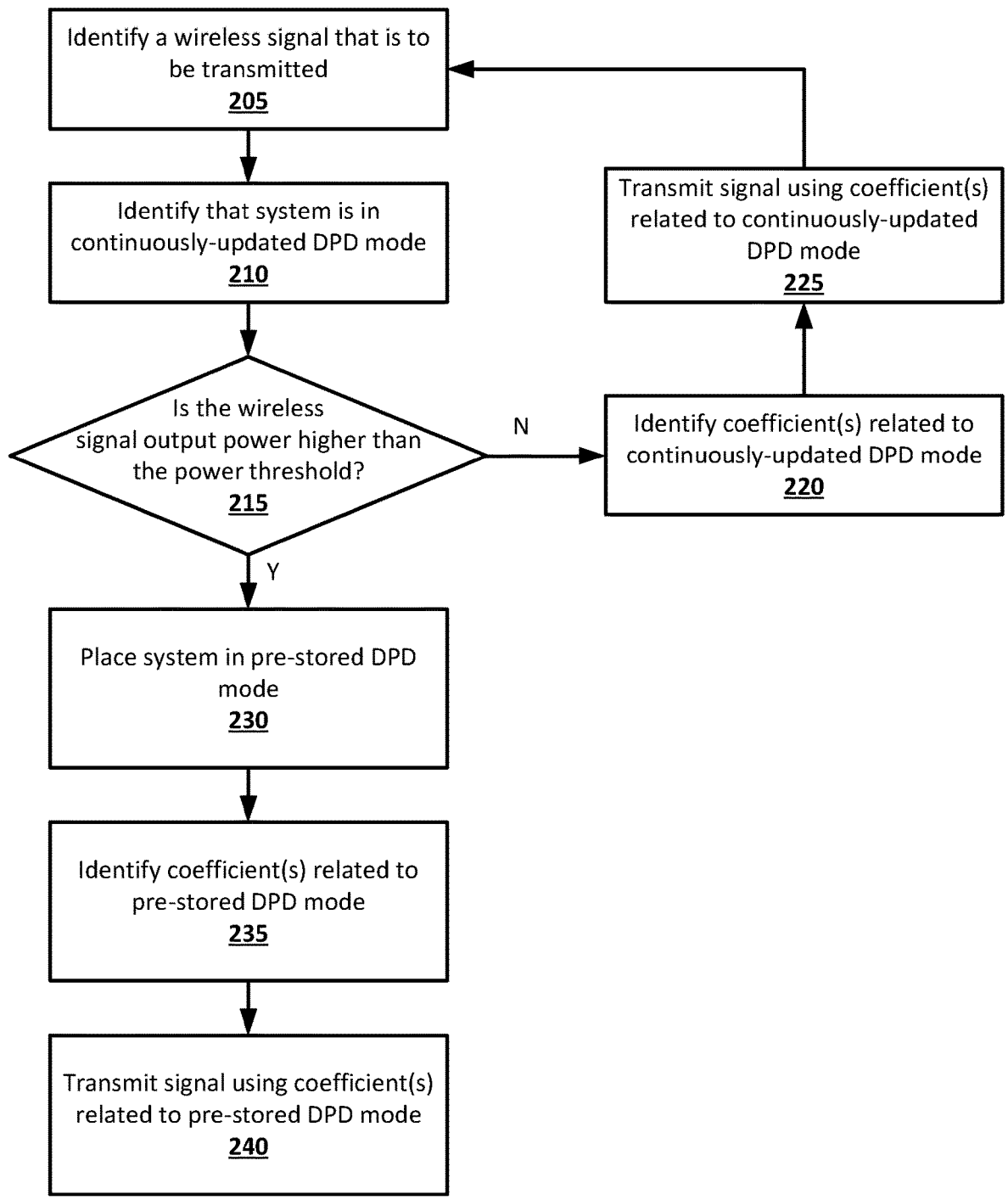
FIG. 2 depicts an example technique by which DPD logic of a wireless transmitter may identify a DPD mode in which a wireless signal may be transmitted.
Figure 3:
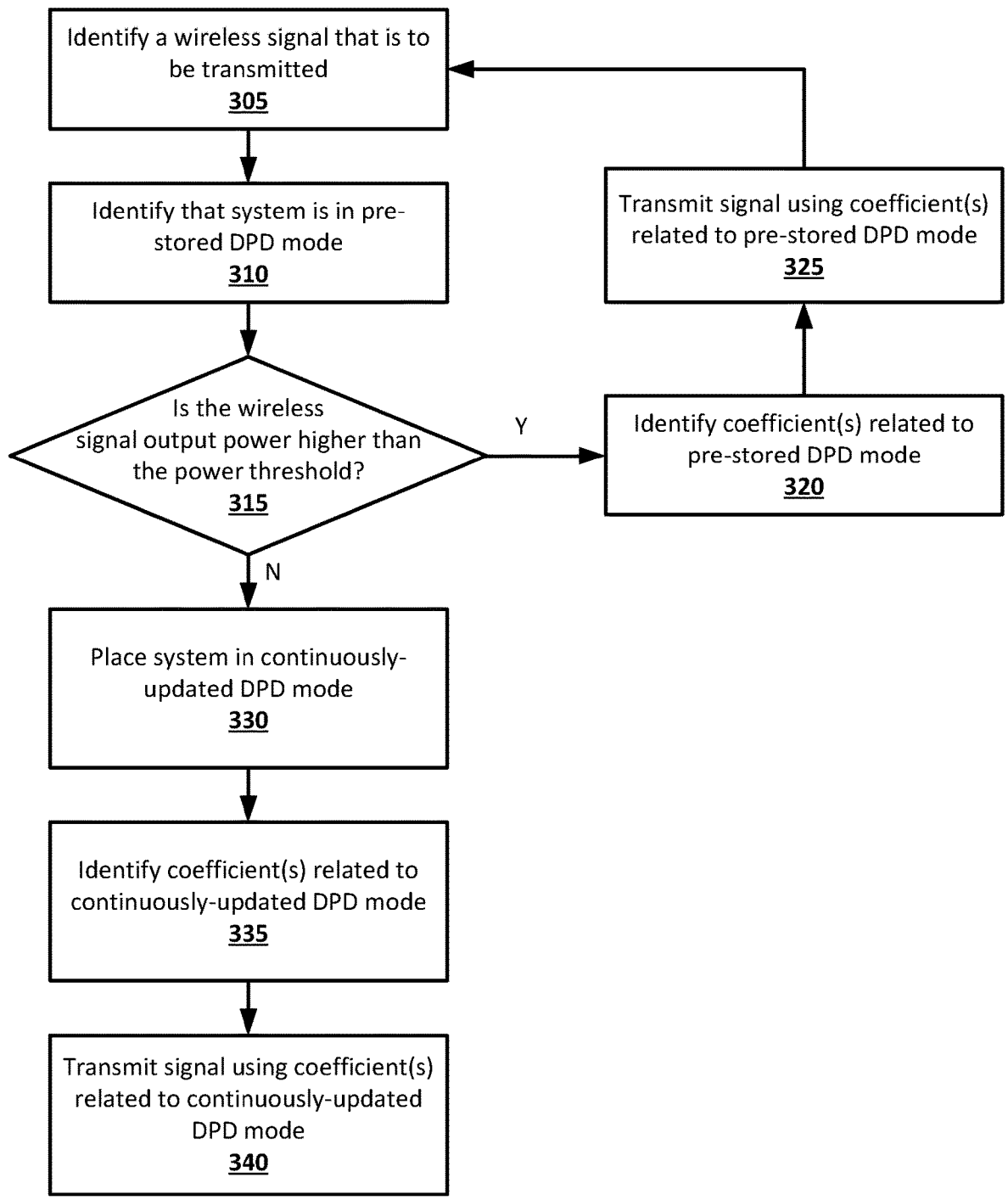
FIG. 3 depicts an alternative example technique by which DPD logic of a wireless transmitter may identify a DPD mode in which a wireless signal may be transmitted.

FIGS. 2 and 3 depict example flowcharts depicting this operation of the DPD logic 110. Specifically, FIG. 2 depicts an example technique by which DPD logic of a wireless transmitter may identify a DPD mode in which a wireless signal may be transmitted.

The technique may include identifying, at 205, a wireless signal that is to be transmitted. As described above, the wireless signal may be a signal that is to be transmitted in accordance with one or more wireless protocols such as LTE, LTE-A, Bluetooth, WiMAX, Wi-Fi, etc.

The technique may further include identifying, at 210, that the system is operating in the continuously-updated DPD mode. That is, the DPD logic 110 may identify that the DPD logic 110 or the wireless transmitter 100 are currently configured to perform DPD on a wireless signal based on one or more continuously-updating coefficients as described above.

The technique may further include identifying, at 215, whether the wireless signal output power is higher than a power threshold. In some embodiments, the power threshold may be identified based on a number of factors. In some embodiments the power threshold may be identified based on a minimum power of the wireless transmitter 100, a maximum power of the wireless transmitter 100, or both. For example, the power threshold may be identified as a midpoint between the minimum and maximum powers of the wireless transmitter 100. In other embodiments the power threshold may be identified as an absolute number, for example approximately 3 decibels (dBs) or some other number. In some embodiments, the power threshold may be identified based on a calibration procedure described above wherein the power threshold is based on one or more power or transmission characteristics of the wireless transmitter. In some embodiments, the power threshold may be based on a combination of one or more of the above factors, or some other factor.

If the output power of the wireless signal that is to be transmitted is not over the power threshold, then the technique may include identifying, at 220, one or more coefficients related to the continuously-updated DPD mode. Specifically, the technique may include identifying one or more continuously-updated coefficients. The identification of the continuously-updated coefficients may be explained in greater detail with respect to FIG. 4.

The technique may then include transmitting (or facilitating transmission of), at 225, the wireless signal using the one or more coefficients related to the continuously-updated DPD mode. More specifically, the DPD 120 logic may perform digital pre-distortion on the wireless signal using the identified one or more continuously-updated coefficients. In some embodiments, the DPD logic 110 may further facilitate the transmission of the wireless signal by providing, or directing another element of the wireless transmitter to provide, the pre-distorted wireless signal to the antenna for transmission. In some embodiments, this facilitation may take the form of providing the pre-distorted wireless signal to the processor 115, the RF circuitry 120, or some other element of the wireless transmitter 100. The technique may then return to element 205 where a subsequent wireless signal may be processed in accordance with embodiments herein.

However, if the wireless signal output power is determined at 215 to be higher than the power threshold, then the technique may include placing, at 230, the system in a pre-stored DPD mode. The pre-stored DPD mode may be similar to the pre-stored DPD mode described above wherein one or more pre-stored DPD coefficients may be used to perform digital pre-distortion of the wireless signal. More specifically, the pre-stored DPD coefficients may be coefficients that are updated based on an update power threshold rather than, for example, the time-based updating of the continuously-updated coefficients.

The technique may then include identifying, at 235, one or more coefficients related to the pre-stored DPD mode. Specifically, the technique may include identifying, at 235, one or more pre-stored DPD coefficients. The identification of the one or more pre-stored DPD coefficients may be described in further detail with respect to FIG. 5.

Finally, the technique may include transmitting (or facilitating the transmission of), at 240, the wireless signal using one or more coefficients related to the pre-stored DPD mode. Specifically, the technique may include transmitting (or facilitating the transmission of), at 240, the wireless signal using the one or more pre-stored DPD coefficients. Similarly to element 225, at element 240 the DPD 120 logic may perform digital pre-distortion on the wireless signal using the identified one or more pre-stored DPD coefficients. In some embodiments, the DPD logic 110 may further facilitate the transmission of the wireless signal by providing, or directing another element of the wireless transmitter to provide, the pre-distorted wireless signal to the antenna for transmission. In some embodiments, this facilitation may take the form of providing the pre-distorted wireless signal to the processor 115, the RF circuitry 120, or some other element of the wireless transmitter 100.

FIG. 3 depicts an alternative example technique by which DPD logic of a wireless transmitter may identify a DPD mode in which a wireless signal may be transmitted. Generally, elements of FIG. 3 may be considered to be similar to, and share one or more characteristics with, elements of FIG. 2. Therefore, certain of the elements of FIG. 3 may not be explained in extensive detail for the sake of lack of redundancy. At a high level, FIG. 3 may be considered to be a continuation of FIG. 2. For example, subsequent to completion of element 240, the DPD logic 110 may proceed to element 305 of FIG. 3. Similarly, FIG. 2 may be considered to be a continuation of FIG. 3. For example, subsequent to completion of element 340 of FIG. 3, the DPD logic 110 may proceed to element 205 of FIG. 2. In this manner the DPD logic 110 may be configured to make informed decisions about the DPD mode in which it should operate and adjust accordingly.

The technique may include identifying, at 305, a wireless signal that is to be transmitted. As described above, the wireless signal may be a signal that is to be transmitted in accordance with one or more wireless protocols such as LTE, LTE-A, Bluetooth, WiMAX, Wi-Fi, etc.

The technique may further include identifying, at 310, that the system is operating in the pre-stored DPD mode. That is, the DPD logic 110 may identify that the DPD logic 110 or the wireless transmitter 100 are currently configured to perform DPD on a wireless signal based on one or more pre-stored DPD coefficients as described above.

The technique may further include identifying, at 315, whether the wireless signal output power is higher than a power threshold. The power threshold may be similar to, for example, the power threshold described above with respect to element 215. In some embodiments, the power thresholds used at elements 215 and 315 (that is, the power threshold used to identify whether to switch from continuously-updated DPD mode to pre-stored DPD mode at 215 and the power threshold used to identify whether to switch from pre-stored DPD mode to continuously-updated DPD mode at 315) may be the same value or may be based on the same factors as one another. In other embodiments, element 215 may use a different power threshold than element 315. Additionally, although elements 215 and 315 are described as being "higher" or "lower," in some embodiments the logic may be based on "higher than or equal to" or "lower than or equal to." The specific logical implementation of the comparison may be different in different embodiments.

If the output power of the wireless signal that is to be transmitted is over the power threshold, then the technique may include identifying, at 320, one or more coefficients related to the pre-stored DPD mode. Specifically, the technique may include identifying one or more pre-stored DPD coefficients. The identification of the pre-stored DPD coefficients may be explained in greater detail with respect to FIG. 5.

The technique may then include transmitting (or facilitating transmission of), at 325, the wireless signal using the one or more coefficients related to the pre-stored DPD mode. This transmission (or facilitation thereof) may be similar to element 240 described above.

However, if the wireless signal output power is determined at 315 to be lower than the power threshold, then the technique may include placing, at 330, the system in the continuously-updated DPD mode. The continuously-updated DPD mode may be similar to the continuously-updated DPD mode described above wherein one or more continuously-updated DPD coefficients may be used to perform digital pre-distortion of the wireless signal.

The technique may then include identifying, at 335, one or more coefficients related to the continuously-updated DPD mode. Specifically, the technique may include identifying, at 335, one or more continuously-updated DPD coefficients. The identification of the one or more continuously-updated DPD coefficients may be described in further detail with respect to FIG. 4.

Finally, the technique may include transmitting (or facilitating the transmission of), at 340, the wireless signal using one or more coefficients related to the continuously-updated DPD mode. Specifically, the technique may include transmitting (or facilitating the transmission of), at 140, the wireless signal using the one or more continuously-updated DPD coefficients. The transmission (or facilitation thereof) may be similar to, and share one or more characteristics with, element 225.

Figure 4:
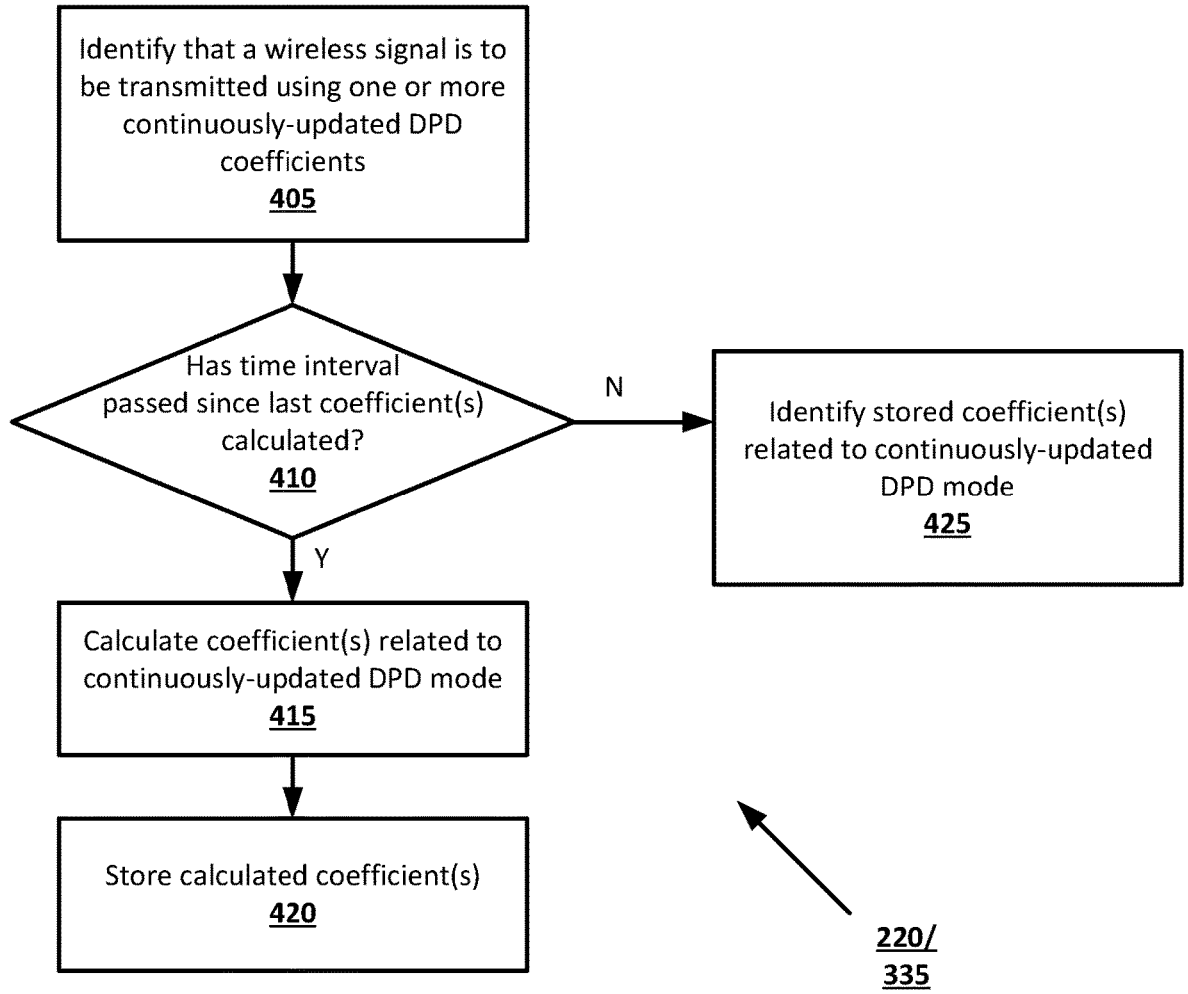
FIG. 4 depicts an example technique by which DPD logic may identify a coefficient to use in a continuously-updated DPD mode.

As noted, the DPD logic 110 may, at elements 220 or 335, identify one or more continuously-updated DPD coefficients. FIG. 4 depicts an example technique by which DPD logic may identify a coefficient to use in a continuously-updated DPD mode. Generally, FIG. 4 may be depicted and discussed with respect to a one or more continuously-updated DPD coefficients. In some embodiments, when the technique is related to a plurality of continuously-updated DPD coefficients, respective ones of the plurality of coefficients may be identified concurrently with one another. In other embodiments, respective ones of the plurality of coefficients may be identified sequentially (that is, in series with one another).

The technique may include identifying, at 405, that a wireless signal is to be transmitted using one or more continuously-updated DPD coefficients. Such identification at 405 may be based on, for example, the identification at 215 or 315 that the wireless signal output power is lower than (or, in some embodiments, equal to) the power threshold. Alternatively, the identification at 405 may be based on, for example, the placement at 330 of the system, the DPD logic 110, or the wireless transmitter 100 in general, in the continuously-updated DPD mode.

The technique may then include identifying, at 410, whether a time interval has passed since the last continuously-updated coefficient(s) were calculated. For example, as noted, the continuously-updated coefficients may be updated based on a time-based variable such as a clock-cycle of the wireless transmitter 100, an electronic device of which the wireless transmitter 100 is a part or to which the wireless transmitter 100 is coupled, a clock-cycle of the DPD logic 110, clock-cycle of the processor 115, or some other time interval.

If the time interval has passed, the the DPD logic 110 may calculate, at 415, one or more coefficients related to the continuously-updated DPD mode. Specifically, the DPD logic 110 may calculate one or more of the continuously-updated DPD coefficients. A continuously-updated DPD coefficient may be calculated based on a number of factors. For example, the continuously-updated DPD coefficient may be calculated based on an output power of a wireless signal that is to be transmitted, an output power of a wireless signal that was recently transmitted, a function of the output power, estimated distortion that may occur during transmission of the wireless signal, or one or more other factors.

The coefficient(s) calculated at 415 may then be stored by the DPD logic 110 for further use. For example, the coefficient(s) calculated at 415 may be stored in a memory such as memory 105. The calculated coefficient(s) may then be retrieved and reused by the DPD logic 110 for operation in the continuously-updated DPD mode until another time interval has passed, at which point the coefficient(s) may be re-calculated.

If the DPD logic 110 identifies at 410 that the time interval has not passed, then the DPD logic 110 may identify, at 425, one or more stored coefficients related to the continuously-updated DPD mode. The one or more stored coefficients identified at 425 may be, for example, the coefficient(s) described above with respect to elements 415 and 420.

It will be understood that FIG. 4 is intended as one example technique, but other variations may be present in other embodiments. For example, in some embodiments the elements of FIG. 4 may be decoupled from one another and split into two or more separate techniques that run in parallel with one another. One such technique could include the identification and retrieval of the continuously-updated DPD coefficients, while another such technique could include monitoring the time interval and periodically updating the continuously-updated DPD coefficients. Other variations may be present in other embodiments.

Figure 5:
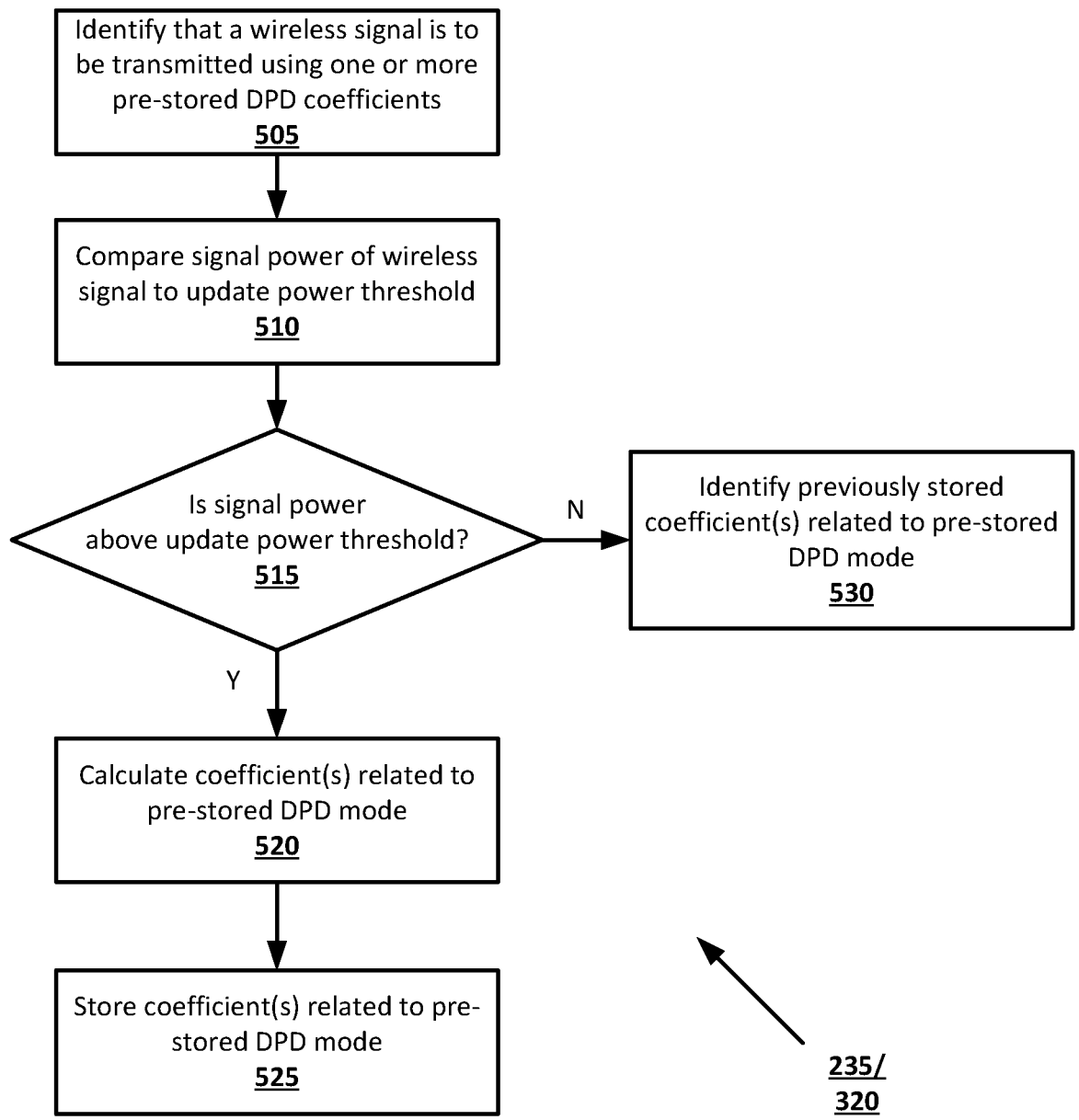
FIG. 5 depicts an alternative example technique by which DPD logic may identify a coefficient to use in a pre-stored DPD mode.

As noted, the DPD logic 110 may, at elements 235 or 320, identify one or more pre-stored DPD coefficients. FIG. 5 depicts an example technique by which DPD logic may identify a coefficient to use in a continuously-updated DPD mode. Generally, FIG. 5 may be depicted and discussed with respect to a one or more pre-stored DPD coefficients. In some embodiments, when the technique is related to a plurality of pre-stored DPD coefficients, respective ones of the plurality of coefficients may be identified concurrently with one another. In other embodiments, respective ones of the plurality of coefficients may be identified sequentially (that is, in series with one another).

The technique may include identifying, at 505, that a wireless signal is to be transmitted using one or more pre-stored DPD coefficients. Such identification at 505 may be based on, for example, the identification at 215 or 315 that the wireless signal output power is higher than (or, in some embodiments, equal to) the power threshold. Alternatively, the identification at 505 may be based on, for example, the placement at 230 of the system, the DPD logic 110, or the wireless transmitter 100 in general, in the pre-stored DPD mode.

The technique may then include comparing, at 510, the signal power of the wireless signal to an update power threshold. Generally, the purpose of the comparison may be to identify, by the DPD logic 110 at 515, whether to update the pre-stored DPD coefficients. Details of the update power threshold are described with respect to FIG. 6.

If the signal power of the wireless signal is identified to be above (or, in some embodiments, greater than or equal to) the update power threshold, then it may be desirable to re-calculate one or more of the pre-stored DPD coefficients. Therefore, the DPD logic 110 may calculate, at 520, one or more of the coefficients related to the pre-stored DPD mode (i.e., the pre-stored DPD coefficients). The coefficients may be calculated based on, for example, the current conditions of the wireless transmitter, the current conditions of the cell, the output signal power of the wireless signal, etc. The calculated pre-stored coefficients may then be stored at 525. The pre-stored DPD coefficients may be stored, for example, in a memory such as memory 105 or some other memory.

If the signal power of the wireless signal is identified at 515 to be less than (or, in some embodiments, less than or equal to) the update power threshold, then the DPD logic 110 may identify previously-stored pre-stored DPD coefficients at 530. In other words, the DPD logic 110 may retrieve the pre-stored DPD coefficients that were calculated at 520 and stored at 525 from the memory 105 (or some other memory).

Figure 6:
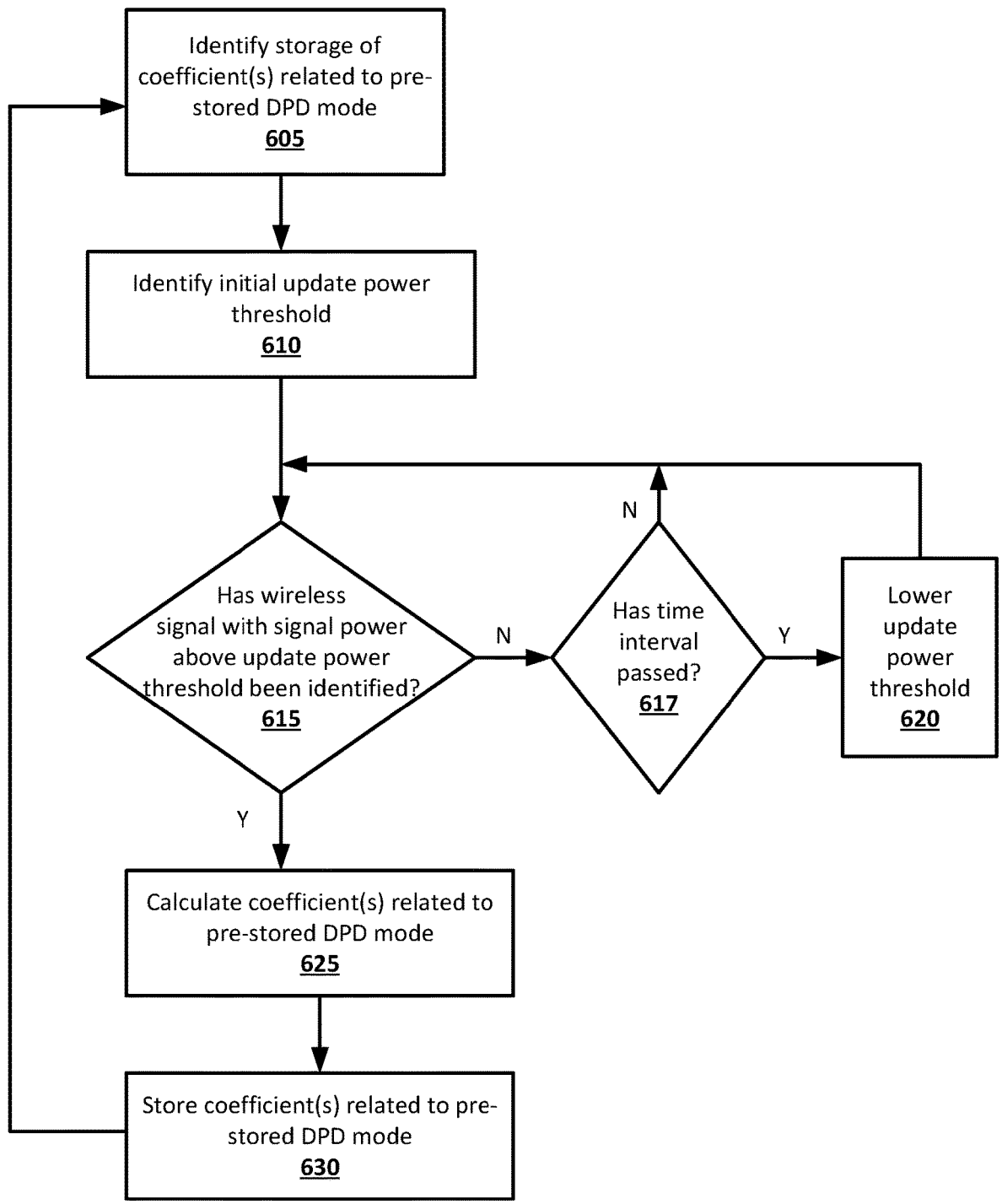
FIG. 6 depicts an example technique by which coefficients related to the pre-stored DPD mode may be updated.

FIG. 6 depicts an example technique by which coefficients related to the pre-stored DPD mode may be updated. Specifically, FIG. 6 describes how a calculation may be performed with respect to the update power threshold. As noted, the update power threshold may be used at 510 and 515 to identify when to update the pre-stored DPD coefficients.

In some cases it may be undesirable to set the update power threshold at the maximum power of the wireless transmitter, and then keep the update power threshold at that level, because it may be relatively rare that a wireless signal is transmitted at the maximum power of the wireless transmitter. Therefore, updating the pre-stored DPD coefficients may be a relatively rare occurrence. In this situation, the pre-stored DPD coefficients may become outdated based on shifting conditions of the wireless cell. Similarly, it may be undesirable to set and maintain the update power threshold at the power at which the pre-stored coefficients were previously calculated. This update power threshold may be undesirable because, similarly, to the maximum power of the wireless transmitter, the pre-stored DPD coefficients may become outdated or stale.

In embodiments herein, the update power threshold may be based on a time-dependent variable. More specifically, the update power threshold may be set at a certain level which may gradually decrease over time. In this way, the pre-stored DPD coefficients may be replaced more often and so the outdatedness or staleness of the coefficients may be mitigated. Generally, this technique is depicted in FIG. 6. In some embodiments, this decaying update power threshold may be depicted in the technique of FIG. 6. In general, the technique of FIG. 6 may be performed by DPD logic 110 (or some other element of a wireless transmitter) generally in parallel with the calculations of other Figures herein such as FIGS. 2-5. In other embodiments, the technique of FIG. 6 may only occur when the wireless transmitter is operating in the pre-stored DPD mode.

The technique may include identifying, at 605, the storage of one or more of the pre-stored DPD coefficients. For example, the technique may include that one or more pre-stored DPD coefficients have been stored in a memory such as is described above with respect to element 525.

The DPD logic 110 may then identify, at 610, an initial update power threshold. The initial update power threshold may be, for example, the power at which the pre-stored DPD coefficients were last calculated (for the sake of ease of discussion, referred to herein as the "previous transmit power"). In other embodiments, the initial update power threshold may be, for example, a function of the previous transmit power. For example, the initial update power threshold may be some percentage of the previous transmit power (e.g., 80%, 90%, or some other percentage). In other embodiments, the initial update power threshold may be a given power range below the previous transmit power. The power range may be, e.g., 3 dBs or some other power range. In other embodiments, the initial update power may be a pre-calibrated or pre-identified power level that is unrelated to the previous transmit power. In other embodiments, the initial update power threshold may be based on one or more additional or alternative factors.

The DPD logic 110 may then identify, at 615, whether a wireless signal with a signal power above the update power threshold has been identified. Specifically, the DPD logic 110 may identify, at 615, whether a wireless signal is to be transmitted with an output power above the update power threshold. In some embodiments, this check may only occur when the DPD logic is operating in the pre-stored DPD mode. In other embodiments, this check at 615 may occur regardless of whether the DPD logic is operating in the pre-stored DPD mode or the continuously-updating DPD mode.

If the DPD logic 110 identifies at 615 that the wireless signal with the transmit power above the current update power threshold has not been identified, then the DPD logic 110 may identify, at 617, whether a given time interval has passed. In some embodiments, the time interval may be measured in clock cycles, milliseconds, seconds, etc. As noted, the update power threshold may be based on a time-dependent variable, and so if the time interval is identified at 617 to have not passed, then the system may return to element 615. However, if the time interval is identified at 617 to have passed at 617, (and a wireless signal with a signal power above the update power threshold has not been identified at 615), then the update power threshold may be lowered at 620. In some embodiments, the lowering may be a percentage (e.g., lowered by 1% of the initial update power or the current update power), lowered by a specific interval (e.g., 1 dB), or some other interval. The system may then return to element 615.

Returning to 615, if a wireless signal with a signal power above the update power threshold is identified at 615, then the DPD logic 110 may calculate, at 625, one or more coefficient(s) related to the pre-stored DPD mode and store, at 630, the one or more DPD coefficients. These elements may be similar (or identical) to elements 525 and 530. In other words, the various elements of FIG. 6 described above may occur concurrently with various elements of FIG. 5, or occur sequentially at some location within the technique of FIG. 5. Therefore, in some embodiments, elements 625 and 630 may respectively be the same as elements 525 and 530.

Generally, it will be understood that the various techniques and elements described above with respect to FIGS. 2-6 are intended as examples of one embodiment. In other embodiments the various techniques may be modified to include more or fewer elements. In some embodiments, certain elements such as elements 615 and 617, which are depicted as sequential, may occur concurrently with one another or in a different order than depicted (e.g., element 617 may occur prior to element 615). Other variations may be present in other embodiments.

Figure 7:
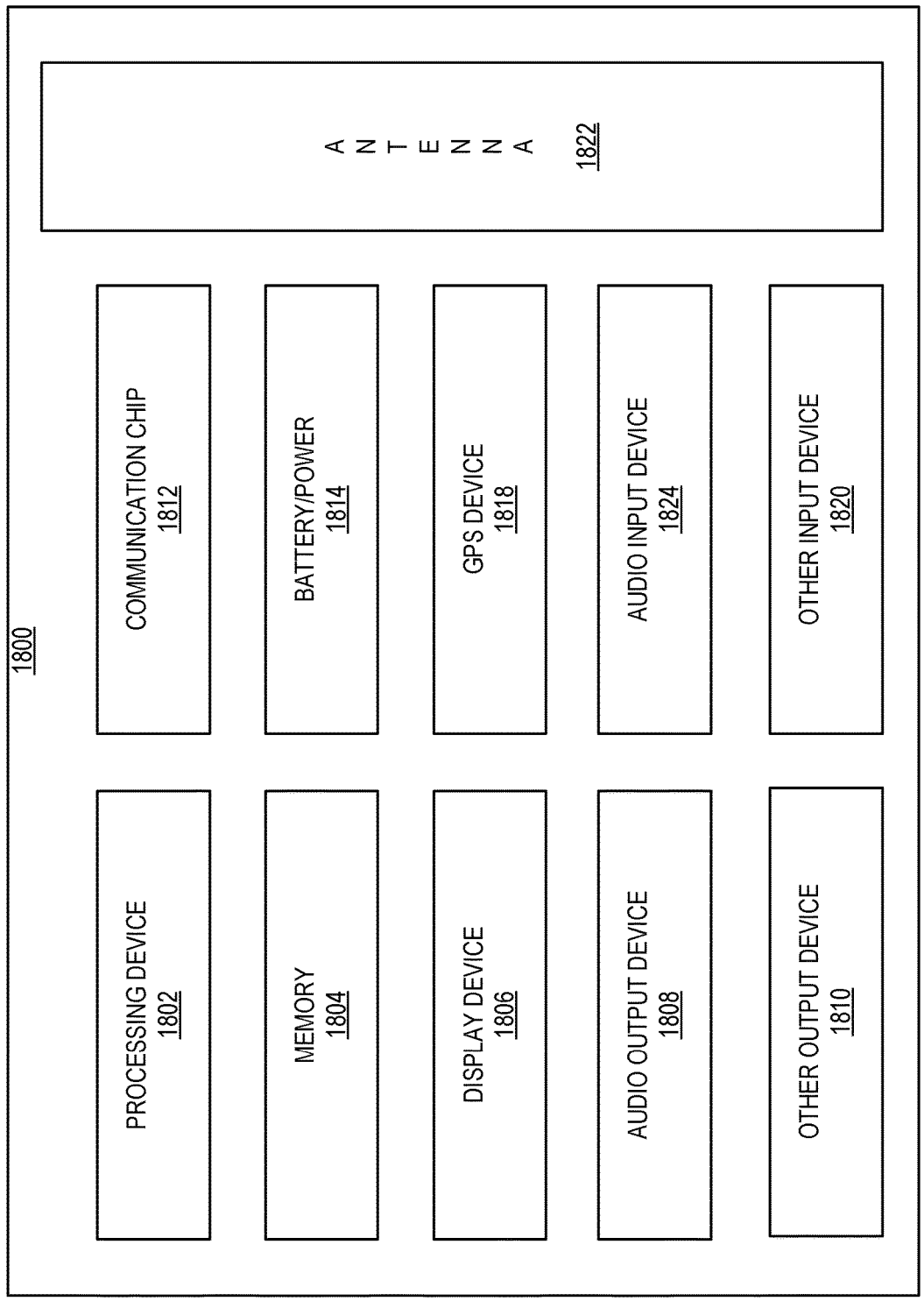
FIG. 7 depicts a block diagram of an example electrical device that may include a DPD logic, in accordance with various embodiments.

FIG. 7 is a block diagram of an example electrical device 1800 that may include be configured to implement the various DPD modes described above, in accordance with any of the embodiments disclosed herein. For example, any suitable ones of the components of the electrical device 1800 may include one or more IC device assemblies, IC packages, IC devices, or dies which may be configured to perform one or more elements of the various techniques discussed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM). Generally, processing device 1802 may be similar to, include, implement, or be a part of processor 115, DPD logic 110, or both. Similarly, the memory 1804 may be similar to memory 105 of FIG. 1.

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions). The antenna 1822 may be similar to, for example, antenna 125 of FIG. 1.

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a method of performing digital pre-distortion (DPD) of a wireless communication, wherein the method comprises: identifying, by DPD logic based on an identification that the wireless signal output power of a wireless signal that is to be transmitted is above a power threshold, that the wireless signal is to be transmitted in accordance with a pre-stored DPD mode that is related to a pre-stored coefficient; shifting, by the DPD logic based on the identification that the wireless signal is to be transmitted in accordance with the pre-stored DPD mode, from a continuously-updating DPD mode to the pre-stored DPD mode, wherein the continuously-updating DPD mode relates to a transmission based on a continuously-updated coefficient; and facilitating, by the DPD logic, transmission of the wireless signal based on the pre-stored coefficient.

Example 2 includes the method of example 1, wherein the power threshold is a first power threshold and the wireless signal is a first wireless signal, and further comprising: identifying, by the DPD logic, that a wireless signal output power of a second wireless signal that is to be transmitted is over an update power threshold; calculating, by the DPD logic, a calculated coefficient related to the wireless signal output power of the second wireless signal; and replacing, by the DPD logic, the pre-stored coefficient with the calculated coefficient.

Example 3 includes the method of example 2, wherein the update power threshold is based on a decreasing time coefficient.

Example 4 includes the method of example 2, wherein the update power threshold is related to a wireless signal output power on which the pre-stored coefficient is based.

Example 5 includes the method of example 1, wherein the power threshold is 3 decibels (dB).

Example 6 includes the method of example 1, wherein the power threshold is at a midpoint between a maximum signal output power and a minimum signal output power of the wireless transmitter.

Example 7 includes the method of example 1, wherein the power threshold is based on a calibration procedure related to a power amplifier of the wireless transmitter.

Example 8 includes the method of any of examples 1-7, wherein the pre-stored coefficient is related to a coefficient that was used to transmit a previous wireless signal with a wireless signal output power over the power threshold.

Example 9 includes the method of any of examples 1-7, further comprising updating, by the DPD logic, the continuously-updated coefficient based on a time interval when the wireless transmitter is operating in the continuously-updating DPD mode.

Example 10 includes the method of example 9, wherein the time interval is between 0.5 seconds 5 seconds.

Example 11 includes the method of any of examples 1-7, wherein the pre-stored coefficient is a coefficient from a table of pre-stored coefficients related to transmission of a wireless signal in the pre-stored DPD mode.

Example 12 includes the method of any of examples 1-7, further comprising: identifying, by the DPD logic after transmission of the wireless signal, that the wireless signal output power of a subsequent wireless signal is below the power threshold; and shifting, by the DPD logic based on the identification that the wireless signal output power is below the power threshold, to the continuously-updating DPD mode.

Example 13 includes one or more non-transitory computer-readable media comprising instructions that, upon execution of the instructions by a computing device, are to cause a digital predistortion (DPD) logic of a computing device to: identify a wireless signal with an output power, wherein the wireless signal is to be transmitted by a wireless transmitter of the computing device; identify, based on an identification that the output power is above a power threshold, that the wireless signal is to be transmitted in accordance with a pre-stored DPD mode instead of a continuously-updating DPD mode; and facilitate transmission of the wireless signal in accordance with the pre-stored DPD mode.

Example 14 includes the one or more non-transitory computer-readable media of example 13, wherein the instructions to facilitate transmission of the wireless signal in accordance with the pre-stored DPD mode include instructions to facilitate the transmission based on a pre-stored coefficient.

Example 15 includes the one or more non-transitory computer-readable media of example 14, wherein the pre-stored coefficient is a coefficient from a table of pre-stored coefficients related to transmission of a wireless signal in the pre-stored DPD mode.

Example 16 includes the one or more non-transitory computer-readable media of example 15, wherein the wireless signal is a first wireless signal, and wherein the instructions are further to: identify a second wireless signal that is to be transmitted; identify that an output power of the second wireless signal is over an update power threshold; calculate a calculated coefficient related to the output power of the second wireless signal; and update the pre-stored coefficient based on the calculated coefficient.

Example 17 includes the one or more non-transitory computer-readable media of example 16, wherein the update power threshold is to decrease based on a time coefficient.

Example 18 includes the one or more non-transitory computer-readable media of example 16, wherein the update power threshold is related to an output power of a wireless signal on which the pre-stored coefficient is based.

Example 19 includes the one or more non-transitory computer-readable media of any of examples 13-18, wherein the power threshold is 3 decibels (dB).

Example 20 includes the one or more non-transitory computer-readable media of any of examples 13-18, wherein the power threshold is at a midpoint between a maximum signal output power and a minimum signal output power of the wireless transmitter.

Example 21 includes the one or more non-transitory computer-readable media of any of examples 13-18, wherein the power threshold is based on a calibration procedure related to a power amplifier of the wireless transmitter.

Example 22 includes the one or more non-transitory computer-readable media of any of examples 13-18, wherein the pre-stored coefficient is related to a coefficient that was used to transmit a previous wireless signal in the pre-stored DPD mode.

Example 23 includes the one or more non-transitory computer-readable media of any of examples 13-18, wherein transmission in accordance with the continuously-updating DPD mode includes transmission using a coefficient that is updated based on a time interval.

Example 24 includes the one or more non-transitory computer-readable media of example 23, wherein the time interval is between 0.5 seconds and 5 seconds.

Example 25 includes the one or more non-transitory computer-readable media of any of examples 13-18, wherein the instructions are further to shift, based on identification that an output power of a subsequent wireless signal is below the power threshold, to the continuously-updating DPD mode.

Example 26 includes an electronic device operable to transmit a wireless signal, wherein the electronic device comprises: a memory to: store a continuously-updated coefficient related to transmission in accordance with a continuously-updating DPD mode; and store a pre-stored coefficient related to transmission in accordance with a pre-stored DPD mode; and digital predistortion (DPD) logic coupled with the memory, wherein the DPD logic is to: update the continuously-updated coefficient based on a time interval; update the pre-stored coefficient based on an update power threshold; and identify whether to operate in accordance with the continuously-updated DPD mode or the pre-stored DPD mode based on a comparison of a power threshold to an output power of a wireless signal that is to be transmitted.

Example 27 includes the electronic device of example 26, wherein the DPD logic is to operate in accordance with the pre-stored DPD mode if the output power is over the power threshold, and operate in accordance with the continuously-updated DPD mode if the output power is under the power threshold.

Example 28 includes the electronic device of example 26, wherein the electronic device further includes a wireless transmitter that is to transmit the wireless signal.

Example 29 includes the electronic device of example 26, wherein, when the DPD logic is to update the pre-stored coefficient based on the update power threshold, the DPD logic is to: identify that a wireless signal output power of a subsequent wireless signal that is to be transmitted is over the update power threshold; calculate a calculated coefficient related to the wireless signal output power of the subsequent wireless signal; and update the pre-stored coefficient with the calculated coefficient.

Example 30 includes the electronic device of example 26, wherein the update power threshold is based on a decreasing time coefficient.

Example 31 includes the electronic device of example 26, wherein the update power threshold is related to a wireless signal output power on which the pre-stored coefficient is based.

Example 32 includes the electronic device of any of examples 26-31, wherein the power threshold is 3 decibels (dB).

Example 33 includes the electronic device of any of examples 26-31, wherein the power threshold is at a midpoint between a maximum signal output power and a minimum signal output power of the wireless transmitter.

Example 34 includes the electronic device of any of examples 26-31, wherein the power threshold is based on a calibration procedure related to a power amplifier of the wireless transmitter.

Example 35 includes the electronic device of any of examples 26-31, wherein the pre-stored coefficient is related to a coefficient that was used to transmit a previous wireless signal with a signal output power that was over the power threshold.

Example 36 includes the electronic device of any of examples 26-31, wherein the time interval is between 0.5 seconds 5 seconds.

Example 37 includes the electronic device of any of examples 26-31, wherein the pre-stored coefficient is a coefficient from a table of pre-stored coefficients related to transmission of a wireless signal in the pre-stored DPD mode.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A method of performing digital predistortion (DPD) of a wireless communication, wherein the method comprises:
   identifying, by DPD logic based on an identification that the wireless signal output power of a wireless signal that is to be transmitted is above a switching power threshold, that the wireless signal is to be transmitted in accordance with a pre-stored DPD mode that is related to a pre-stored coefficient that is updated based on an update power threshold;
   shifting, by the DPD logic based on the identification that the wireless signal is to be transmitted in accordance with the pre-stored DPD mode, from a continuously-updating DPD mode to the pre-stored DPD mode, wherein the continuously-updating DPD mode relates to a transmission based on a continuously-updated coefficient that is updated based on a time interval; and
   facilitating, by the DPD logic, transmission of the wireless signal based on the pre-stored coefficient.

2. The method of claim 1, wherein the wireless signal is a first wireless signal, and further comprising:
   identifying, by the DPD logic, that a wireless signal output power of a second wireless signal that is to be transmitted is over the update power threshold;
   calculating, by the DPD logic, a calculated coefficient related to the wireless signal output power of the second wireless signal; and
   replacing, by the DPD logic, the pre-stored coefficient with the calculated coefficient.

3. The method of claim 1, wherein the switching power threshold is 3 decibels (dB).

4. The method of claim 1, wherein the switching power threshold is at a midpoint between a maximum signal output power and a minimum signal output power of the wireless transmitter.

5. The method of claim 1, wherein the switching power threshold is based on a calibration procedure related to a power amplifier of the wireless transmitter.

6. The method of claim 1, wherein the pre-stored coefficient is related to a coefficient that was used to transmit a previous wireless signal with a wireless signal output power over the switching power threshold.

7. The method of claim 1, further comprising updating, by the DPD logic, the continuously-updated coefficient based on a time interval when the wireless transmitter is operating in the continuously-updating DPD mode.

8. One or more non-transitory computer-readable media comprising instructions that, upon execution of the instructions by a computing device, are to cause a digital predistortion (DPD) logic of a computing device to:
   identify a wireless signal with an output power, wherein the wireless signal is to be transmitted by a wireless transmitter of the computing device;
   identify, based on an identification that the output power is above a power threshold, that the wireless signal is to be transmitted in accordance with a pre-stored DPD mode instead of a continuously-updating DPD mode, wherein the pre-stored DPD mode is related to a pre-stored coefficient;
   facilitate transmission of the wireless signal in accordance with the pre-stored DPD mode;
   identify a second wireless signal that is to be transmitted;
   identify that an output power of the second wireless signal is over an update power threshold;
   calculate a calculated coefficient related to the output power of the second wireless signal; and
   update the pre-stored coefficient based on the calculated coefficient.

9. The one or more non-transitory computer-readable media of claim 8, wherein the pre-stored coefficient is a coefficient from a table of pre-stored coefficients related to transmission of a wireless signal in the pre-stored DPD mode.

10. The one or more non-transitory computer-readable media of claim 8, wherein the update power threshold is to decrease based on a time coefficient.

11. The one or more non-transitory computer-readable media of claim 8, wherein the update power threshold is related to an output power of a wireless signal on which the pre-stored coefficient is based.

12. The one or more non-transitory computer-readable media of claim 8, wherein the instructions are further to shift, based on identification that an output power of a subsequent wireless signal is below the power threshold, to the continuously-updating DPD mode.

13. An electronic device operable to transmit a wireless signal, wherein the electronic device comprises:
   a memory to:
      store a continuously-updated coefficient related to transmission in accordance with a continuously-updating DPD mode; and
      store a pre-stored coefficient related to transmission in accordance with a pre-stored DPD mode; and
   digital predistortion (DPD) logic coupled with the memory, wherein the DPD logic is to:
      update the continuously-updated coefficient based on a time interval;
      update the pre-stored coefficient based on an update power threshold; and
      identify whether to operate in accordance with the continuously-updated DPD mode or the pre-stored DPD mode based on a comparison of a power threshold to an output power of a wireless signal that is to be transmitted.

14. The electronic device of claim 13, wherein the DPD logic is to operate in accordance with the pre-stored DPD mode if the output power is over the power threshold, and operate in accordance with the continuously-updated DPD mode if the output power is under the power threshold.

15. The electronic device of claim 13, wherein, when the DPD logic is to update the pre-stored coefficient based on the update power threshold, the DPD logic is to:
   identify that a wireless signal output power of a subsequent wireless signal that is to be transmitted is over the update power threshold;
   calculate a calculated coefficient related to the wireless signal output power of the subsequent wireless signal; and
   update the pre-stored coefficient with the calculated coefficient.

16. The electronic device of claim 13, wherein the update power threshold is based on a decreasing time coefficient.

17. The electronic device of claim 13, wherein the pre-stored coefficient is related to a coefficient that was used to transmit a previous wireless signal with a signal output power that was over the power threshold.

18. The electronic device of claim 13, wherein the pre-stored coefficient is a coefficient from a table of pre-stored coefficients related to transmission of a wireless signal in the pre-stored DPD mode.

* * * * *